(12) United States Patent
Lee

(10) Patent No.: US 9,564,547 B2
(45) Date of Patent: Feb. 7, 2017

(54) SOLAR CELL MODULE AND METHOD OF MANUFACTURING THE SAME

(75) Inventor: Sungeun Lee, Seoul (KR)

(73) Assignee: LG ELECTRONICS INC., Seoul (KR)

(*) Notice: Subject to any disclaimer, the term of this patent is extended or adjusted under 35 U.S.C. 154(b) by 756 days.

(21) Appl. No.: 12/888,949

(22) Filed: Sep. 23, 2010

(65) Prior Publication Data

US 2011/0073166 A1 Mar. 31, 2011

(30) Foreign Application Priority Data

Sep. 28, 2009 (KR) .................. 10-2009-0091620

(51) Int. Cl.
| | | |
|---|---|---|
| H01L 31/00 | (2006.01) | |
| H01L 31/068 | (2012.01) | |
| H01L 31/0224 | (2006.01) | |
| H01L 31/05 | (2014.01) | |
| H01L 31/048 | (2014.01) | |

(52) U.S. Cl.
CPC ... H01L 31/0682 (2013.01); H01L 31/022441 (2013.01); H01L 31/0481 (2013.01); H01L 31/0508 (2013.01); H01L 31/0516 (2013.01); H01L 31/048 (2013.01); Y02E 10/547 (2013.01); Y10T 29/49355 (2015.01)

(58) Field of Classification Search
CPC ........... H01L 31/022441; H01L 31/048; H01L 31/0481; H01L 31/05; H01L 31/0512; H01L 31/0516
USPC ....................................... 136/256
See application file for complete search history.

(56) References Cited

U.S. PATENT DOCUMENTS

| | | | |
|---|---|---|---|
| 5,597,422 A | 1/1997 | Kataoka et al. | |
| 2004/0014888 A1 | 1/2004 | Fournier et al. | |
| 2006/0207646 A1 | 9/2006 | Terreau et al. | |
| 2007/0151599 A1* | 7/2007 | Cousins | 136/263 |
| 2008/0053516 A1* | 3/2008 | Hayes | 136/251 |
| 2008/0236655 A1* | 10/2008 | Baldwin et al. | 136/251 |
| 2009/0032087 A1 | 2/2009 | Kalejs | |
| 2009/0151771 A1* | 6/2009 | Kothari et al. | 136/246 |

FOREIGN PATENT DOCUMENTS

| | | |
|---|---|---|
| JP | 7-302925 A | 11/1995 |
| JP | 2001-135846 A | 5/2001 |
| JP | 2005-191479 A | 7/2005 |
| KR | 10-2006-0035733 A | 4/2006 |

* cited by examiner

Primary Examiner — Matthew Martin
(74) Attorney, Agent, or Firm — Birch, Sterwart, Kolasch & Birch, LLP

(57) ABSTRACT

A solar cell module and a method of manufacturing the same are discussed. The solar cell module includes a plurality of back contact solar cells, an interconnector that is positioned on back surfaces of the plurality of back contact solar cells and electrically connects adjacent back contact solar cells to one another, upper and lower protective layers for protecting the plurality of back contact solar cells, a transparent member that is positioned on the upper protective layer on light receiving surfaces of the plurality of back contact solar cells, and a back sheet that is positioned under the lower protective layer on surfaces opposite the light receiving surfaces of the plurality of back contact solar cells. The upper protective layer and the lower protective layer are formed of different materials.

5 Claims, 2 Drawing Sheets

SOLAR CELL MODULE AND METHOD OF MANUFACTURING THE SAME This application claims priority to and the benefit of Korean Patent Application No. 10-2009-0091620 filed in the Korean Intellectual Property Office on Sep. 28, 2009, the entire contents of which are incorporated herein by reference.

BACKGROUND OF THE INVENTION

Field of the Invention

Example embodiments of the invention relate to a solar cell module and a method of manufacturing the same.

Description of the Related Art

Recently, as existing energy sources such as petroleum and coal are expected to be depleted, interests in renewable energy for replacing the existing energy sources are increasing. As the renewable energy, solar cells for generating electric energy from solar energy have been particularly spotlighted. A back contact solar cell capable of increasing the size of a light receiving area by forming both an electron electrode and a hole electrode on a back surface of a substrate (i.e., the surface of the substrate on which light is not incident) has been recently developed. Hence, the efficiency of the back contact solar cell is improved.

A solar cell module manufactured by connecting the plurality of back contact solar cells each having the above-described structure in series or in parallel to one another is used to obtain a desired output. The solar cell module is a moisture-proof module manufactured in a panel form.

SUMMARY OF THE INVENTION

In one aspect, there is a solar cell module including a plurality of back contact solar cells, an interconnector that is positioned on back surfaces of the plurality of back contact solar cells and electrically connects adjacent back contact solar cells to one another, a protective layer for protecting the plurality of back contact solar cells, a transparent member that is positioned on light receiving surfaces of the plurality of back contact solar cells, and a back sheet that is positioned opposite the light receiving surfaces of the plurality of back contact solar cells, wherein the protective layer includes a cured liquid filler. In this instance, the cured liquid filler covers an entire surface of the interconnector positioned between the back contact solar cells to directly contact the interconnector.

In another aspect, there is a solar cell module including a plurality of back contact solar cells, an interconnector that is positioned on back surfaces of the plurality of back contact solar cells and electrically connects adjacent back contact solar cells to one another, upper and lower protective layers for protecting the plurality of back contact solar cells, a transparent member that is positioned on the upper protective layer on light receiving surfaces of the plurality of back contact solar cells, and a back sheet that is positioned under the lower protective layer on surfaces opposite the light receiving surfaces of the plurality of back contact solar cells, wherein the upper protective layer and the lower protective layer are formed of different materials.

The lower protective layer may be formed of cured siloxane, for example, poly dialkyl siloxane. The upper protective layer may be formed of ethylene vinyl acetate (EVA) of a film form.

After a liquid siloxane precursor is applied to the plurality of back contact solar cells, a portion of the applied siloxane precursor is filled in a space between the back contact solar cells because of the fluidity properties of the siloxane precursor and is cured through a thermal process. Hence, the cured siloxane precursor is attached to the upper protective layer.

A front surface of the interconnector may be processed to have the same color as semiconductor substrate of the plurality of back contact solar cells or the back sheet, for example, black or white, so as to prevent a metal color of the interconnector from being observed through a light receiving surface of the solar cell module.

In another aspect, there is a method of manufacturing a solar cell module including positioning an upper protective layer of a film form on a transparent member, positioning a plurality of back contact solar cells on the upper protective layer at constant intervals, electrically connecting adjacent back contact solar cells to one another using an interconnector, applying a liquid siloxane precursor to the plurality of back contact solar cells to fill a space between the adjacent back contact solar cells with a portion of the applied liquid siloxane precursor, and performing a curing process using a thermal processing to attach the liquid siloxane precursor to the upper protective layer of the film form and to cure the liquid siloxane precursor.

The thermal processing may be performed in a state where a back sheet is positioned on the liquid siloxane precursor and may be performed at a temperature of 200° C. to 400° C.

The cured siloxane precursor may contain poly dialkyl siloxane. The upper protective layer may be formed of ethylene vinyl acetate (EVA) of a film form.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
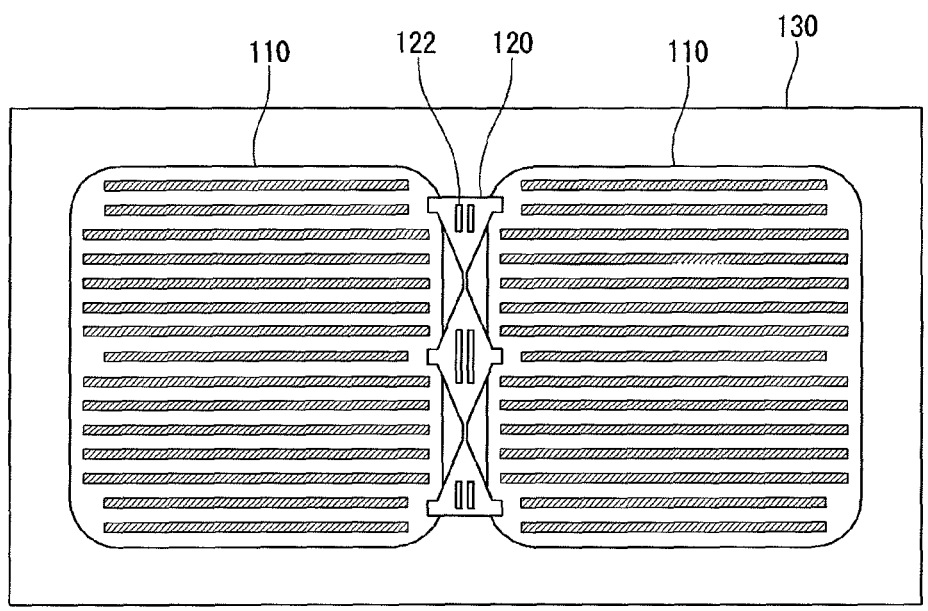
FIG. 1 is a plane view of a solar cell module according to an example embodiment of the invention from which a back sheet is removed.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

A solar cell module according to an example embodiment of the invention is described in detail with reference to FIGS. 1 to 3.

FIG. 1 is a plane view of a solar cell module according to an example embodiment of the invention from which a back sheet is removed. FIG. 2 is a partial cross-sectional view of the solar cell module shown in FIG. 1. FIG. 3 is a partial cross-sectional view of a back contact solar cell shown in FIG. 1.

Figure 2:
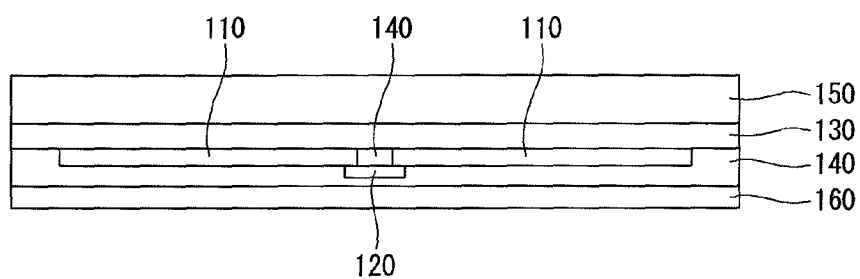
FIG. 2 is a partial cross-sectional view of the solar cell module shown in FIG. 1.

As shown in FIGS. 1 and 2, a solar cell module according to an example embodiment of the invention includes a plurality of back contact solar cells 110, an interconnector 120 that is positioned on back surfaces of the back contact solar cells 110 and electrically connects the adjacent back contact solar cells 110 to one another, upper and lower protective layers 130 and 140 for protecting the back contact solar cells 110, a transparent member 150 that is positioned on the upper protective layer 130 on light receiving surfaces of the back contact solar cells 110, and a back sheet 160 that is positioned under the lower protective layer 140 on surfaces opposite the light receiving surfaces of the back contact solar cells 110.

Although FIGS. 1 and 2 show only the two back contact solar cells 110, the number of back contact solar cells 110 is not limited in the example embodiment of the invention.

The back sheet 160 prevents moisture or oxygen from penetrating into a back surface of the solar cell module, thereby protecting the back contact solar cells 110 from an external environment. The back sheet 160 may have a multi-layered structure including a moisture/oxygen penetrating prevention layer, a chemical corrosion prevention layer, a layer having insulating characteristics, etc.

The upper protective layer 130 is attached to the lower protective layer 140 in a state where the upper protective layer 130 is positioned on the back contact solar cells 110. Hence, the upper and lower protective layers 130 and 140 and the back contact solar cells 110 form an integral body. The upper and lower protective layers 130 and 140 prevent corrosion of the back contact solar cells 110 resulting from the moisture penetration and protect the back contact solar cells 110 from an impact.

In the example embodiment, the upper protective layer 130 and the lower protective layer 140 are formed of different materials. More specifically, the upper protective layer 130 is formed of a material such as ethylene vinyl acetate (EVA) manufactured in a film form. The lower protective layer 140 is formed of a cured material obtained by performing thermal processing on a liquid compound, for example, cured siloxane containing poly dialkyl siloxane. The cured material (or liquid filler) may cover an entire surface of the interconnector 120 positioned between the back contact solar cells 110 to directly contact the interconnector 120.

When a liquid siloxane precursor is applied to the back contact solar cells 110, a portion of the applied siloxane precursor is filled in a space between the back contact solar cells 110 because of the fluidity properties of the siloxane precursor and is cured through a thermal process.

In the structure of the solar cell module, a reason to form the lower protective layer 140 using the liquid compound is that a process for manufacturing the solar cell module can be automatized by removing a shield used in the related art. The reason is described in detail in a method of manufacturing the solar cell module which will be described below.

The transparent member 150 on the upper protective layer 130 is formed of a tempered glass having a high transmittance and excellent damage prevention characteristic. The tempered glass may be a low iron tempered glass containing a small amount of iron. The transparent member 150 may have an embossed inner surface so as to increase a scattering effect of light.

The interconnector 120 is formed of a conductive metal and is soldered to tabbing metal electrodes formed in the back contact solar cells 110 to electrically connect the adjacent back contact solar cells 110 to one another. Portions of the interconnector 120 may have a trapezoidal shape or a triangular shape, but are not limited thereto.

In the example embodiment, the lower protective layer 140 maintains a distance between the adjacent back contact solar cells 110 and provides an electrical insulation between the adjacent back contact solar cells 110. Hence, when the interconnector 120 is observed through the light receiving surface of the solar cell module, the interconnector 120 may be observed in (or disposed over) a space between the adjacent back contact solar cells 110.

However, the interconnector 120 is formed of a conductive metal of a different color from the back contact solar cells 110. Accordingly, one surface of the interconnector 120 (i.e., the surface of the interconnector 120 toward the light receiving surface of the solar cell module) may be processed or treated with (or to have) the same color as the semiconductor substrate 111 of the back contact solar cell 110 or the back sheet 160, for example, black or white, so as to improve an appearance of the solar cell module.

The interconnector 120 may have slits 122 for reducing strains resulting from an expansion or a contraction of the interconnector 120 generated by heat or lack thereof.

Figure 3:
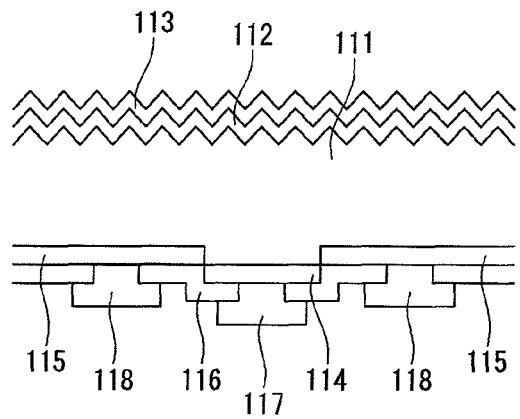
FIG. 3 is a partial cross-sectional view of a back contact solar cell shown in FIG. 1.

As shown in FIG. 3, the back contact solar cell 110 used in the solar cell module includes a semiconductor substrate 111 of a first conductive type, a front surface field (FSF) layer 112 formed at one surface (for example, a light receiving surface) of the semiconductor substrate 111, an anti-reflection layer 113 formed on the FSF layer 112, a first doped region 114 that is formed at another surface of the semiconductor substrate 111 and is heavily doped with first conductive type impurities, a second doped region 115 that is formed at the another surface of the semiconductor substrate 111 at a location adjacent to the first doped region 114 and is heavily doped with second conductive type impurities opposite the first conductive type impurities, a back passivation layer 116 exposing a portion of each of the first doped region 114 and the second doped region 115, a hole electrode 117 (hereinafter referred to as "a first electrode") electrically connected to the exposed portion of the first doped region 114, and an electron electrode 118 (hereinafter referred to as "a second electrode") electrically connected to the exposed portion of the second doped region 115.

The light receiving surface of the semiconductor substrate 111 is textured to form a textured surface corresponding to an uneven surface having a plurality of uneven portions. In this instance, each of the FSF layer 112 and the anti-reflection layer 113 has a textured surface.

The semiconductor substrate 111 is formed of single crystal silicon of the first conductive type, for example, n-type, though not required. Alternatively, the semiconductor substrate 111 may be of a p-type and may be formed of polycrystalline silicon. Further, the semiconductor substrate 111 may be formed of other semiconductor materials other than silicon.

Because the light receiving surface of the semiconductor substrate 111 is the textured surface, an absorptance of light increases. Hence, the efficiency of the back contact solar cell 110 is improved.

The FSF layer 112 formed at the textured surface of the semiconductor substrate 111 is a region that is more heavily doped with, for example, impurities of a group V element such as phosphorus (P), arsenic (As), and antimony (Sb) than the semiconductor substrate 111. The FSF layer 112 performs an operation similar to a back surface field (BSF) layer. Thus, a recombination and/or a disappearance of electrons and holes separated by incident light around the light receiving surface of the semiconductor substrate 111 are prevented or reduced.

The anti-reflection layer 113 on the surface of the FSF layer 112 is formed of silicon nitride (SiNx) and/or silicon dioxide ($SiO_2$), etc. The anti-reflection layer 113 reduces a reflectance of incident light and increases a selectivity of a predetermined wavelength band, thereby increasing the efficiency of the back contact solar cell 110.

The first doped region 114 is a p-type heavily doped region, and the second doped region 115 is a region that is more heavily doped with n-type impurities than the semiconductor substrate 111. Thus, the first doped region 114 and the n-type semiconductor substrate 111 form a p-n junction. The first doped region 114 and the second doped region 115 serve as a moving path of carriers (electrons and holes) and respectively collect holes and electrons.

The back passivation layer 116 exposing a portion of each of the first doped region 114 and the second doped region 115 is formed of silicon nitride (SiNx), silicon dioxide ($SiO_2$), or a combination thereof. The back passivation layer 116 prevents or reduces a recombination and/or a disappearance of electrons and holes separated from carriers and reflects incident light to the inside of the back contact solar cell 110 so that the incident light is not reflected to the outside of the back contact solar cell 110. Namely, the back passivation layer 116 prevents a loss of the incident light and reduces a loss amount of the incident light. The back passivation layer 116 may have a single-layered structure or a multi-layered structure such as a double-layered structure or a triple-layered structure.

The first electrode 117 is formed on the first doped region 114 not covered by the back passivation layer 116 and on a portion of the back passivation layer 116 adjacent to the first doped region 114. The second electrode 118 is formed on the second doped region 115 not covered by the back passivation layer 116 and on a portion of the back passivation layer 116 adjacent to the second doped region 115. Thus, the first electrode 117 is electrically connected to the first doped region 114, and the second electrode 118 is electrically connected to the second doped region 115. The first and second electrodes 117 and 118 are spaced apart from each other at a constant distance and extend parallel to each other in one direction.

As described above, because a portion of each of the first and second electrodes 117 and 118 overlaps a portion of the back passivation layer 116 and is connected to a bus bar area, a contact resistance and a series resistance decrease when the first and second electrodes 117 and 118 contact an external driving circuit, etc. Hence, the efficiency of the back contact solar cell 110 can be improved.

A method of manufacturing the solar cell module according to the example embodiment of the invention is described with reference to FIG. 4.

Figure 4:
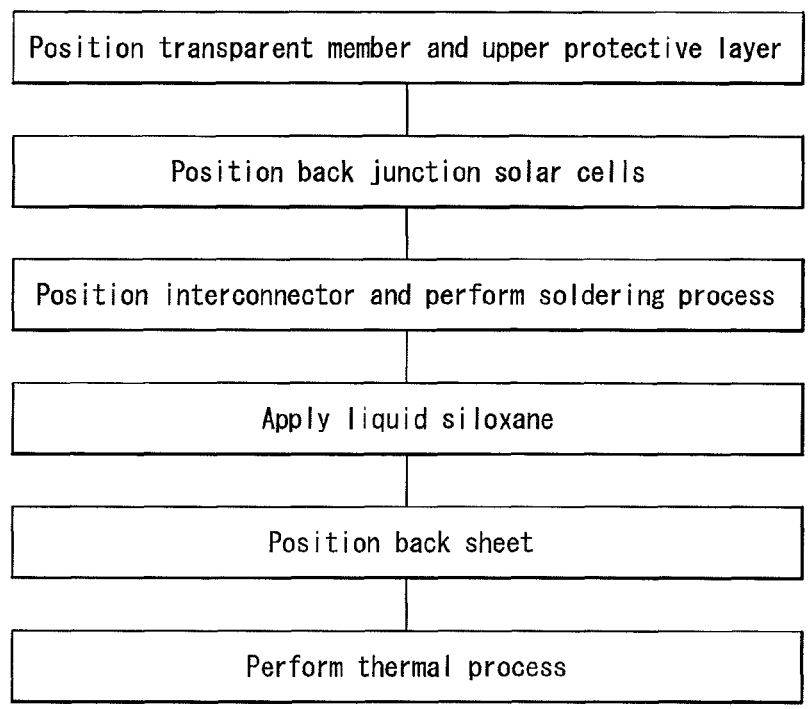
FIG. 4 is a block diagram sequentially illustrating a method of manufacturing a solar cell module according to an example embodiment of the invention.

FIG. 4 is a block diagram sequentially illustrating a method of manufacturing the solar cell module according to the example embodiment of the invention.

As shown in FIGS. 1 to 4, first, the upper protective layer 130 of the film form is positioned on the transparent member 150. As described above, the upper protective layer 130 is formed of ethylene vinyl acetate (EVA).

After the upper protective layer 130 is positioned, the plurality of back contact solar cells 110 is positioned on the upper protective layer 130 at constant intervals. The interconnector 120 is soldered to the tabbing metal electrodes of the adjacent back contact solar cells 110 to electrically connect the adjacent back contact solar cells 110 to one another.

Subsequently, the liquid siloxane precursor, for example, poly dialkyl siloxane, is applied to the back contact solar cells 110. The liquid siloxane precursor may be, or include, dimethylsilyl oxy acrylate in other embodiments. A portion of the applied liquid siloxane precursor is filled in a space between the adjacent back contact solar cells 110. In this instance, an amount of the applied liquid siloxane precursor may be adjusted within the proper range.

Subsequently, the back sheet 160 is positioned on the liquid siloxane precursor, and a thermal process is performed at a temperature of 200° C. to 400° C. to cure the liquid siloxane precursor. When a curing process is performed through the thermal process, the cured siloxane precursor is attached to the upper protective layer 130 and the back sheet 160. The attachment between the upper protective layer 130 and the transparent member 150 may be achieved through the thermal process or a separate lamination process.

In the method of manufacturing the solar cell module according to the example embodiment, the lower protective layer maintains the distance between the adjacent back contact solar cells and also provides the electrical insulation between the adjacent back contact solar cells. Because the lower protective layer is formed using the liquid compound, a process for positioning components of the solar cell module may be automatized.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A solar cell module, comprising:
a plurality of back contact solar cells;
an interconnector that electrically connects adjacent back contact solar cells serially;
an upper protective layer, which is positioned on light receiving surfaces of the plurality of back contact solar cells;

a lower protective layer, which is positioned on an opposite side of the light receiving surfaces of the plurality of back contact solar cells;
a transparent member that is positioned on the upper protective layer; and
a back sheet that is positioned under the lower protective layer,
wherein the upper protective layer is positioned between the plurality of back contact solar cells and the transparent member, and the lower protective layer is positioned between the plurality of back contact solar cells and the back sheet,
wherein the upper protective layer and the lower protective layer are formed of different materials from each other,
wherein the lower protective layer is further positioned between the interconnector and the back sheet,
wherein the upper protective layer is formed of ethylene vinyl acetate (EVA) of a film form, and the lower protective layer consists of a single layered cured siloxane,
wherein the lower protective layer fills a space between the plurality of the back contact solar cells, and
wherein the lower protective layer physically and directly contacts each of front and back surfaces of the interconnector in an area between the adjacent back contact solar cells.

2. The solar cell module of claim 1, wherein the cured siloxane contains poly dialkyl siloxane.

3. The solar cell module of claim 1, wherein each back contact solar cell comprises:
a semiconductor substrate of a first conductive type;
a front surface field layer formed at a front surface of the semiconductor substrate;
an anti-reflection layer formed on the front surface field layer;
a first doped region that is formed at a back surface of the semiconductor substrate and is heavily doped with first conductive type impurities;
a second doped region that is formed at the back surface of the semiconductor substrate at a location adjacent to the first doped region and is heavily doped with second conductive type impurities opposite the first conductive type impurities;
a back passivation layer exposing a portion of each of the first doped region and the second doped region;
a first electrode electrically connected to the exposed portion of the first doped region; and
a second electrode electrically connected to the exposed portion of the second doped region.

4. A solar cell module, comprising:
a plurality of back contact solar cells;
an interconnector that electrically connects adjacent back contact solar cells serially;
a transparent member that is positioned on light receiving surfaces of the plurality of back contact solar cells;
a back sheet that is positioned under surfaces opposite the light receiving surfaces of the plurality of back contact solar cells;
a first protective layer positioned between the plurality of back contact solar cells and the transparent member;
a second protective layer positioned between the plurality of back contact solar cells and the back sheet and positioned between the interconnector and the back sheet, a portion of the second protective layer being filled in a space formed by the adjacent back contact solar cells,
wherein the first protective layer and the portion of the second protective layer filled in the space formed by the adjacent back contact solar cells are formed of different materials, and
wherein the first protective layer is formed of ethylene vinyl acetate (EVA) of a film form, and the second protective layer consists of a single layered cured siloxane, and
wherein the second protective layer physically and directly contacts each of front and back surfaces of the interconnector in an area between the adjacent back contact solar cell.

5. A solar cell module, comprising:
a plurality of back contact solar cells;
an interconnector that electrically connects adjacent back contact solar cells to one another;
a transparent member that is positioned on light receiving surfaces of the plurality of back contact solar cells;
a back sheet that is positioned under surfaces opposite the light receiving surfaces of the plurality of back contact solar cells;
a first protective layer positioned between the plurality of back contact solar cells and the transparent member;
a second protective layer positioned between the plurality of back contact solar cells and the back sheet and positioned between the interconnector and the back sheet, a portion of the second protective layer being filled in a space formed by the adjacent back contact solar cells,
wherein a front surface of the interconnector contacting the portion of the second protective layer has the same color as a semiconductor substrate of the plurality of back contact solar cells or the back sheet, and
wherein the first protective layer is formed of ethylene vinyl acetate (EVA) of a film form, and the second protective layer consists of a single layered cured siloxane, and
wherein the second protective layer physically and directly contacts each of front and back surfaces of the interconnector in an area between the adjacent back contact solar cells.

* * * * *